US006962831B2

(12) United States Patent
Najafi et al.

(10) Patent No.: US 6,962,831 B2
(45) Date of Patent: Nov. 8, 2005

(54) METHOD OF MAKING A THICK MICROSTRUCTURAL OXIDE LAYER

(75) Inventors: Khalil Najafi, Ann Arbor, MI (US); Chunbo Zhang, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 214 days.

(21) Appl. No.: 10/342,949

(22) Filed: Jan. 15, 2003

(65) Prior Publication Data

US 2003/0224565 A1 Dec. 4, 2003

Related U.S. Application Data

(60) Provisional application No. 60/349,125, filed on Jan. 16, 2002.

(51) Int. Cl.[7] .............................................. H01L 21/66
(52) U.S. Cl. ............................. 438/52; 438/50; 438/51; 438/53
(58) Field of Search .......................... 438/52–53, 50–51

(56) References Cited

U.S. PATENT DOCUMENTS

| 4,211,582 | A | | 7/1980 | Horng et al. | |
|---|---|---|---|---|---|
| 6,461,888 | B1 | * | 10/2002 | Sridhar et al. | ................. 438/52 |
| 2001/0013630 | A1 | * | 8/2001 | Cho et al. | .................... 257/419 |

FOREIGN PATENT DOCUMENTS

| EP | 0 996 149 A | 4/2000 |
|---|---|---|
| JP | 11051893 | 2/1999 |

OTHER PUBLICATIONS

Rossi, Carole, et al., Realization, Characterization of Micro Pyrotechnic Actuators and FEM Modelling of the Combustion Ignition, 1998 Elsevier Science S.A., 70, pp. 141–147.
Cai, Jun, et al., A Partial SOI Technology For Single–Chip RF Power Amplifiers, International Electron Devices Meeting 2001, IEDM Technical Digest, Washington, D.C., Dec. 2–5, 2001, New York, NY: IEEE, U.S. Dec. 2, 2001, pp. 891–894.

Kugimiya, K., et al., 101–stage 2 $\mu$m Gate Ring Oscillators In Laser–Grown Silicon, Islands Embedded in $SiO_2$, 8179 IEE Electron Devices Leters, vol. EDL–3, No. 9, New York, Sep. 1982.

Lehmann, V., Porous Silicon—A New Material For MEMS, MEMS 1996, Munchen, Germany, pp. 1–6.

Nam, Choong–Mo, et al., Selective Oxidized Porous Silicon (SOPS) Substrate for Microwave Power Chip–Packaging, Electrical Performance of Electronic Packaging, IEEE $5^{th}$ Topical Meeting, 1996, pp. 202–204.

Haiyan, Ou, et al., Thick $SiO_2$ Layer Produced By Anodisation, Electronics Letters, V35, 1999, pp. 1950–1951.

* cited by examiner

Primary Examiner—Dung A. Le
(74) Attorney, Agent, or Firm—Brooks Kushman, P.C.

(57) ABSTRACT

A method of fabricating a thick silicon dioxide layer without the need for long deposition or oxidation and a device having such a layer are provided. Deep reactive ion etching (DRIE) is used to create high-aspect ratio openings or trenches and microstructures or silicon pillars, which are then oxidized and/or refilled with LPCVD oxide or other deposited silicon oxide films to create layers as thick as the DRIE etched depth allows. Thickness in the range of 10–100 $\mu$m have been achieved. Periodic stiffeners perpendicular to the direction of the trenches are used to provide support for the pillars during oxidation. The resulting $SiO_2$ layer is impermeable and can sustain large pressure difference. Thermal tests show that such thick silicon dioxide diaphragms or layers can effectively thermally isolate heated structures from neighboring structures and devices within a distance of hundred of microns. Such $SiO_2$ diaphragms or layers of thickness 50–60 $\mu$m can sustain an extrinsic shear stress up to 3–5 Mpa. These thick insulating microstructures or layers can be used in thermal, mechanical, fluidic, optical, and bio microsystems.

16 Claims, 1 Drawing Sheet

METHOD OF MAKING A THICK MICROSTRUCTURAL OXIDE LAYER

This application claims the benefit of provisional application No. 60/349,125, filed Jan. 16, 2002.

STATEMENT REGARDING FEDERALLY SPONSORED RESEARCH OR DEVELOPMENT

The invention was made with Government support under Contract No. N00019-98-K-0111 awarded by DARPA. The Government has certain rights to the invention.

BACKGROUND OF THE INVENTION

1. Field of the Invention

This invention relates to methods of making a thick microstructural oxide layer and devices utilizing same.

2. Background Art $SiO_2$ is a very desirable MEMS material, because of its low thermal conductivity, low thermal expansion coefficient, and good mechanical strength. Thick (10–100 $\mu$m) $SiO_2$ layers have a variety of applications for thermal isolation in emerging high-temperature systems, for mechanical support of suspend elements in RFMEMS, and for micropackaging. Limited by diffusion/deposition rate, it is not feasible to produce thick $SiO_2$ using standard high-temperature oxidation or deposition.

V. Lehmann, "Porous silicon-a new material for MEMS," *MEMS '96*, pp. 106, describes one approach to fabricating thick $SiO_2$ involving converting a portion of a silicon substrate to porous silicon by anodization, and then oxidizing the porous silicon to create a thick $SiO_2$ layer of thickness ~25 $\mu$m, as described by C. Nam, Y.-S. Kwon in their paper "Selective oxidized porous silicon (SOPS) substrate for microwave power chip-packaging," *Electrical Performance of Electronic Packaging*, IEEE 5$^{th}$ Topical Meeting, 1996, pp. 202–204; and Ou Haiyan, Yang Qinqing, Lei Hongbing, Wang Hongjie, Wang Qiming, Hu Xiongwei in their paper "Thick $SiO_2$ layer produced by anodisation," *Electronics Letters*, V35, 1999, pp. 1950–1951.

SUMMARY OF THE INVENTION

An object of the present invention is to provide a method of making a thick microstructural oxide layer and device utilizing same without the need for long deposition or oxidation times.

In carrying out the above object and other objects of the present invention, a method of making a thick microstructural oxide layer is provided. The method includes the steps of providing a substrate and selectively removing material from the substrate to obtain high aspect ratio openings in the substrate separated by microstructures. The method also includes the step of oxidizing the microstructures so that the microstructures are oxidized and are joined together by oxide to create the oxide layer.

The substrate may be a silicon substrate and the oxide layer may be a silicon dioxide layer.

The oxide layer may have a thickness in the range of 10–100 $\mu$m.

The oxide layer may be substantially impermeable and able to sustain a large pressure difference between two outer surfaces of the oxide layer.

The step of oxidizing may refill the openings by consuming the microstructures through oxidation and lateral growth of oxide into the openings.

The method may further include releasing the oxide layer from the substrate.

The method may further include the step of refilling the openings with an oxide film which may be a deposited silicon oxide film.

The openings may be elongated in a first direction wherein the method may further include the step of forming stiffeners substantially perpendicular to the first direction and connected to the microstructures to support the microstructures prior to the step of oxidizing.

Further in carrying out the above object and other objects of the present invention a device is provided. The device includes a substrate and a substantially impermeable, thick microstructural oxide layer formed on the substrate.

The oxide layer may be a silicon dioxide microstructural layer and the substrate may be a silicon substrate.

The oxide layer may have a thickness in the range of 10–100 $\mu$m.

The device may include an island supported and thermally isolated from the substrate by the oxide layer.

The oxide layer may be a ring which surrounds the island.

The device may be a low power, high temperature microheater.

The above object and other objects, features, and advantages of the present invention are readily apparent from the following detailed description of the best mode for carrying out the invention when taken in connection with the accompanying drawings.

DETAILED DESCRIPTION OF THE PREFERRED EMBODIMENT(S)

In general, a method of fabricating silicon dioxide layers as thick as 100 $\mu$m without the need for long deposition or oxidation times and resulting devices are described herein. $SiO_2$ is a very desirable MEMS material, because of its low thermal conductivity, low thermal expansion coefficient, and good mechanical strength. Very thick (10–100's $\mu$m) $SiO_2$ layers have a variety of applications in emerging high-temperature systems for thermal isolation, for mechanical support of suspend elements in RFMEMS, and for micropackaging. It is not feasible to produce thick $SiO_2$ using standard high-temperature oxidation or deposition.

Figures 1, 2:
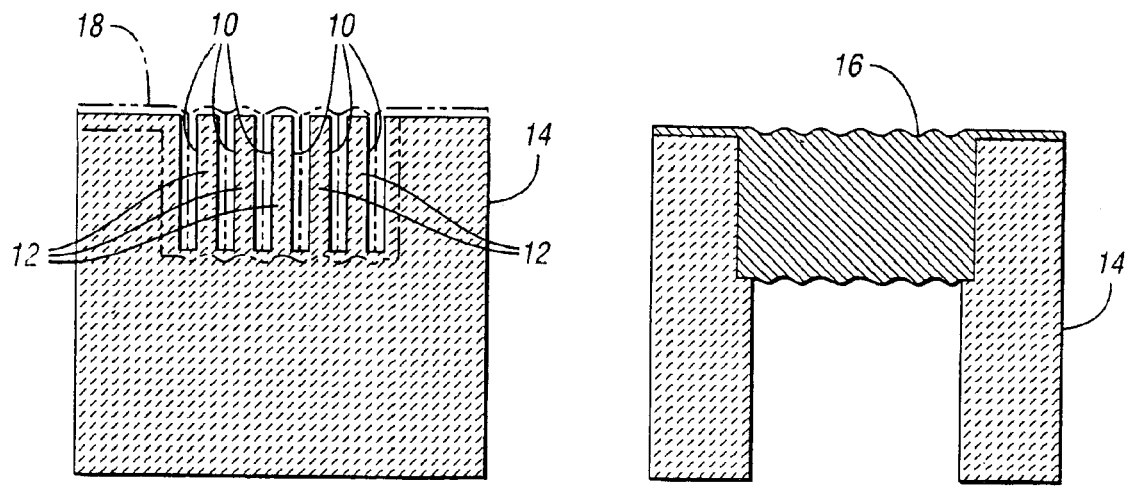
FIG. 1 is a side view, partially broken away and in cross-section, of a substrate having etched pillars wherein phantom lines are provided to illustrate the final thick $SiO_2$ contour after trenches are refilled by oxidation and possibly including LPCVD oxide deposition.
FIG. 2 is a side view, partially broken away and in cross-section, of a thick oxide layer after release by removing silicon under the oxide layer by back-side etching.

The preferred method described herein uses DRIE to create high aspect ratio openings or trenches 10 and silicon microstructures or pillars 12 in a silicon substrate 14, which are then oxidized and/or refilled with LPCVD oxide to create an oxide layer 16 as thick as the DRIE allows, as shown in FIGS. 1 and 2.

FIG. 1 shows the process of trench refilling by consuming the Si pillars 12 through oxidation and outgrowth of oxide 18 into the trenches 10. To get an exact refill, the ratio of silicon pillar width to trench opening should be ~0.8. To minimize the time needed for oxidizing the silicon, a narrow layer is preferred. However, a wide silicon pillar is also important to resist damage during the process.

A test structure where the width of Si pillars 12 is ~2.0 μm and the trench opening is ~1.5 μm was fabricated. After DRIE etches trenches 10 in the Si substrate 14 to ~60 μm, the wafer 14 is wet-oxidized for 10 hours at 1100° C. to refill the trench 10 and join all the $SiO_2$ layers or microstructures together to form the thick layer 16. Because of the non-ideal side-wall profile formed by DRIE, the top and bottom of the thick layer 16 join strongly, but voids are formed in the middle of the layer 16. For many applications this is okay, but for some applications requiring excellent mechanical strength it is preferred that the entire layer 16 be of solid material(s).

To avoid the formation of voids, one can use both oxidation of Si pillars 12 and refilling of the trenches 10 using deposited LPCVD oxide. With the same mask specifications as the previously described process, a trench 10 with larger width on top and gradually narrower width going towards the bottom can be obtained. After 10 hours of wet oxidization at 1100° C., the trench bottom gets refilled by lateral growth of oxide, but the top is still open. LPCVD oxide is then deposited to refill and seal the opening. Using this method, the thick oxide layer 16 does not have voids in the middle. However, the large stress in narrow Si pillars 12 bends the oxide pillars 12 and produces some openings between adjacent areas that cannot be completely filled by LPCVD oxide.

Figure 3:
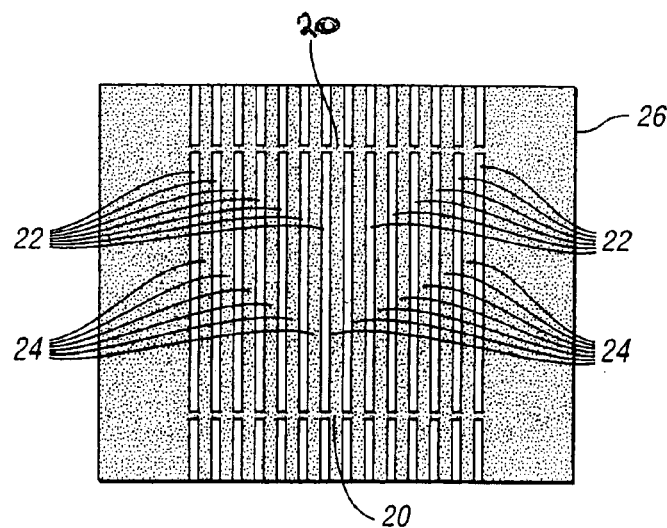
FIG. 3 is a top view, partially broken away, of the substrate after trenches are formed but prior to oxidation and further illustrating periodic stiffeners perpendicular to the trenches to provide support for the pillars.

This stress problem may be solved by adding stiffeners 20 perpendicular to the direction of trenches 22 to provide support for the pillars 24 formed on a substrate 26, as shown in FIG. 3. This stress problem can also be overcome by using thicker Si pillars 24. A new mask was designed, where the width of the stiffeners 20 is ~1.4 μm with a pitch of 20 μm along the trench direction (at junction regions the pitch is as small as 5 μm to further strengthen those particular stressed regions). On the new mask, the width of Si pillars 24 was increased to ~2.8 μm and the trench opening to ~1.2 μm. Correspondingly, the wet oxidation time was increased to 15–20 hours at 1100° C. to fully oxidize the wider bottom of the resulting Si pillars 24. The top is totally refilled without bending opening. Although the top surface is not smooth, metal lines of thickness about 1000 Å can still be deposited on the top surface by evaporation.

Figure 4:
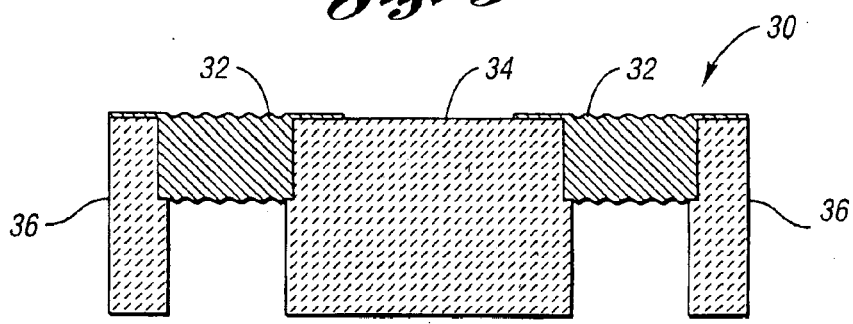
FIG. 4 is a side view, partially broken away and in cross-section, of a device including a silicon island suspended by a thick oxide layer or ring.

A structure or device in the form of a low power, high temperature micro-heater 30 with a $SiO_2$ ring 32 (340 μm wide, 60 μm thick) surrounding a Si island 34 (5 mm×5 mm×0.5 mm) has been fabricated for thermal and mechanical tests, as shown schematically in FIG. 4. A heater and temperature sensor (not shown) is fabricated inside the Si island 34 and a temperature sensor (not shown) is located on the outside of the $SiO_2$ ring 32. The $SiO_2$ ring 32 effectively thermally isolates the island 34 from a support ring 36 with a temperature difference of ~70° C. when the silicon island 34 is ~200–300° C. From this measurement, the thermal conductivity of thick $SiO_2$ is ~1W/(m·K). It is also shown that the diaphragm or ring 32 can sustain a pressure of 2 psi.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for making a thick microstructural oxide layer, the method comprising the steps of:
   providing a substrate;
   selectively removing material from the substrate to obtain high aspect ratio openings in the substrate separated by microstructures; and
   oxidizing the microstructures so that the microstructures are oxidized and are joined together by oxide to create the oxide layer wherein the step of oxidizing refills the openings by consuming the microstructures through oxidation and lateral growth of oxide into the openings.

2. The method as claimed in claim 1 wherein the substrate is a silicon substrate and the oxide layer is a silicon dioxide layer.

3. The method as claimed in claim 1 wherein the oxide layer has a thickness in the range of 10–100 μm.

4. The method as claimed in claim 1 wherein the oxide layer is substantially impermeable and can sustain a large pressure difference between two outer surfaces of the oxide layer.

5. The method as claimed in claim 1 further comprising releasing the oxide layer from the substrate.

6. The method as claimed in claim 1 further comprising refilling the openings with an oxide film.

7. The method as claimed in claim 6 wherein the oxide film is a deposited silicon oxide film.

8. The method as claimed in claim 1 wherein the openings are elongated in a first direction and wherein the method further comprises forming stiffeners substantially perpendicular to the first direction and connected to the microstructures to support the microstructures prior to the step of oxidizing.

9. A method for making a thick microstructural oxide layer, the method comprising the steps of:
   providing a substrate;
   selectively removing material from the substrate to obtain high aspect ratio openings in the substrate separated by microstructures; and
   oxidizing the microstructures so that the microstructures are oxidized and are joined together by oxide to create the oxide layer wherein the openings are elongated in a first direction and wherein the method further comprises forming stiffeners substantially perpendicular to the first direction and connected to the microstructures to support the microstructures prior to the step of oxidizing.

10. The method as claimed in claim 9 wherein the substrate is a silicon substrate and the oxide layer is a silicon dioxide layer.

11. The method as claimed in claim 9 wherein the oxide layer has a thickness in the range of 10–100 μm.

12. The method as claimed in claim 9 wherein the oxide layer is substantially impermeable and can sustain a large pressure difference between two outer surfaces of the oxide layer.

13. The method as claimed in claim 9 wherein the step of oxidizing refills the openings by consuming the microstructures through oxidation and lateral growth of oxide into the openings.

14. The method as claimed in claim 9 further comprising releasing the oxide layer from the substrate.

15. The method as claimed in claim 9 further comprising refilling the openings with an oxide film.

16. The method as claimed in claim 15 wherein the oxide film is a deposited silicon oxide film.

* * * * *